United States Patent
Matsushima et al.

(10) Patent No.: US 7,683,580 B2
(45) Date of Patent: Mar. 23, 2010

(54) REMAINING-BATTERY-CAPACITY ESTIMATING APPARATUS, REMAINING-BATTERY-CAPACITY ESTIMATING METHOD, AND REMAINING-BATTERY-CAPACITY ESTIMATING COMPUTER PROGRAM

(75) Inventors: Toshio Matsushima, Saitama (JP); Nobuhiko Susuki, Tokyo (JP); Hiroshi Wakaki, Tokyo (JP)

(73) Assignee: NTT Facilities, Inc., Tokyo (JP)

( * ) Notice: Subject to any disclaimer, the term of this patent is extended or adjusted under 35 U.S.C. 154(b) by 593 days.

(21) Appl. No.: 11/505,982

(22) Filed: Aug. 18, 2006

(65) Prior Publication Data

US 2007/0046263 A1 Mar. 1, 2007

(30) Foreign Application Priority Data

Aug. 19, 2005 (JP) .............................. 2005-238741
May 22, 2006 (JP) .............................. 2006-141742

(51) Int. Cl.
*H01J 7/00* (2006.01)
*G01N 27/416* (2006.01)
*G08B 21/00* (2006.01)

(52) U.S. Cl. ........................ 320/132; 320/133; 324/426; 340/636.1; 340/636.21

(58) Field of Classification Search .................. 320/132, 320/133
See application file for complete search history.

(56) References Cited

U.S. PATENT DOCUMENTS

| | | | |
|---|---|---|---|
| 5,148,043 A | 9/1992 | Hirata et al. | |
| 5,218,288 A | 6/1993 | Mickal et al. | |
| 5,936,383 A * | 8/1999 | Ng et al. | ...................... 320/132 |
| 6,087,808 A | 7/2000 | Pritchard | |
| 6,275,042 B1 | 8/2001 | Tsai | |
| 6,329,792 B1 | 12/2001 | Dunn et al. | |
| 2001/0050561 A1 | 12/2001 | Rundkvist | |
| 2005/0029988 A1* | 2/2005 | Tran | ........................... 320/132 |

FOREIGN PATENT DOCUMENTS

EP 0146377 A1 6/1985
JP 09-227050 A 9/1997

OTHER PUBLICATIONS

K. Kozuka et al., "Development of On-Line Battery Testing Technology", Proceedings of INTELE, vol. 18-2, pp. 397-402, Japan (1997).
European Search Report of Patent Application No. 06254355 dated Jul. 8, 2009 (EPO).

* cited by examiner

*Primary Examiner*—Edward Tso
*Assistant Examiner*—Yalkew Fantu
(74) *Attorney, Agent, or Firm*—Rader, Fishman & Grauer, PLLC

(57) ABSTRACT

A remaining-battery-capacity estimating apparatus estimates the remaining capacity of a battery used as a backup. The apparatus reduces the voltage output from a rectifier to an actual load, measures current flowing from the rectifier and the battery to the actual load and a dummy load device provided separately from the actual load, controls the load of the dummy load device such that the measured current is a predetermined value, and calculates the remaining capacity of the battery based on the terminal voltage of the battery and the discharging time of discharging the battery to the actual load and the dummy load device, by referring to battery data indicating the relationship among the discharging time of the battery, the terminal voltage of the battery, and the remaining capacity of the battery, at a predetermined current of the battery.

12 Claims, 12 Drawing Sheets

REMAINING-BATTERY-CAPACITY ESTIMATING APPARATUS, REMAINING-BATTERY-CAPACITY ESTIMATING METHOD, AND REMAINING-BATTERY-CAPACITY ESTIMATING COMPUTER PROGRAM

CROSS-REFERENCES TO RELATED APPLICATION

This application claims priority from Japanese Patent Application Serial Nos. 2005-238741 filed Aug. 19, 2005, and 2006-141742 filed May 22, 2006, the contents of which are incorporated herein by reference in their entireties.

TECHNICAL FIELD

Described herein is a remaining-battery-capacity estimating apparatus, remaining-battery-capacity estimating method, and remaining-battery-capacity estimating computer program having a function for estimating the remaining capacity of a secondary battery, particularly a lithium-ion battery, in a power supply system that includes the secondary battery as a backup.

BACKGROUND

In conventional DC power supply systems for supplying electrical power directly to communication devices, such as those used for telephone switching, backup storage batteries are maintained by the floating charge method. In such systems, a load and a storage battery are connected in parallel to an output of a rectifier so that the rectifier continuously supplies DC power to the load and a required charging current to the storage battery to fully charge it according to the charged state of the battery. In this system, if a power failure or a rectifier malfunction occurs, the storage battery immediately starts discharging to avoid interruption of power supplied to the load even for a moment.

Since a storage battery is employed in such systems where high reliability is required, the state of the system should desirably be determined by examining the remaining capacity of the storage battery to see whether the storage battery can achieve a sufficient performance.

In view of these circumstances, some methods for checking and monitoring the state of a backup storage battery have been studied. In one of these methods, it is checked whether the power supply function of a battery works well under a normal operation condition where a power supply system is supplying electrical power to an actual load. In this method, the storage battery is discharged by reducing the output voltage of the rectifier for a predetermined time to examine the voltage characteristic during the discharge period (refer to KOZUKA, et al. "Development of On-line Battery Testing Technology", Proceedings of INTELE '97, 18-2, P. 397).

However, the above-described conventional technology, where the output voltage of the rectifier is reduced only for a predetermined time to carry out discharge the storage battery, is intended to check whether the charging and discharging circuits of the storage battery are operating normally. Therefore, the technology is not appropriate for obtaining the remaining capacity of the storage battery.

Even if an attempt is made to estimate the remaining capacity of the storage battery, constant discharging current from the storage battery will not be guaranteed since the discharging current flows directly through an actual fluctuating load. For this reason, the discharge-voltage characteristic obtained in this manner differs from the constant-current discharge characteristic and hence cannot be used to estimate the remaining capacity of the storage capacity.

Furthermore, the fact that the relationship between the remaining capacity and the voltage characteristic of the storage battery has not been clarified is the most significant bottleneck to estimating the remaining battery capacity.

SUMMARY

The embodiments include a remaining-battery-capacity estimating apparatus, a remaining-battery-capacity estimating method, and a remaining-battery-capacity estimating computer program that are capable of estimating the remaining capacity of a storage battery.

The remaining-battery-capacity estimating apparatus for estimating the remaining capacity of a battery to be measured, includes a rectifier-voltage control section for reducing the output voltage of a rectifier that supplies electrical power to an actual load; a dummy load device provided separately from the actual load; a load-current measurement section for measuring current that flows from the rectifier and the battery to the actual load and the dummy load device; a control section for controlling the load of the dummy load device such that the current measured by the load-current measurement section is a predetermined value; a battery-data storage section for storing battery data indicating the relationship among a discharging time of the battery, a terminal voltage of the battery, and the remaining capacity of the battery, at a predetermined current of the battery; and an arithmetic section for calculating the remaining capacity of the battery based on a discharging time of the battery and a terminal voltage of the battery corresponding to the discharging time, at a discharging current flowing in the dummy load device and the actual load, by referring to the battery data stored in the battery-data storage section.

In the remaining-battery-capacity estimating apparatus, the battery-data storage section may store battery data indicating the relationship between the remaining capacity of the battery and the difference between the terminal voltage of the battery at a given discharging current and a given elapsed discharging time and the terminal voltage of the battery being maintained at a fully charged state before discharging.

In the remaining-battery-capacity estimating apparatus, the battery-data storage section may store battery data indicating the relationship between the remaining capacity of the battery and the difference between the terminal voltage of the battery in a reference charged state and the terminal voltage of the battery in a discharged state, at a given discharging current and a given elapsed discharging time.

In the remaining-battery-capacity estimating apparatus, the battery-data storage section may store battery data indicating the relationship between the terminal voltage of the battery and an elapsed discharging time of the battery for each remaining capacity of the battery.

In the remaining-battery-capacity estimating apparatus, the battery-data storage section may store battery data for each discharging condition, which includes at least one of the manufacturer, the supplier, the production lot, the model, the temperature, the discharging current value, and the elapsed discharging time of the battery.

In the remaining-battery-capacity estimating apparatus, the rectifier-voltage control section may stop reducing the voltage output from the rectifier when the voltage of the battery decreases to a predetermined value while electrical power is supplied from the battery to the actual load and the dummy load device.

The remaining-battery-capacity estimating method for estimating the remaining capacity of a battery to be measured, includes the steps of reducing the output voltage of a rectifier that supplies electrical power to an actual load; measuring current flowing from the rectifier and the battery to the actual load and a dummy load device provided separately from the actual load; controlling the load of the dummy load device such that the measured current is a predetermined value; and calculating the remaining capacity of the battery based on a discharging time of the battery and a terminal voltage of the battery corresponding to the discharging time, at a discharging current flowing in the dummy load device and the actual load, by referring to a battery-data storage section for storing battery data indicating the relationship among the discharging time of the battery, the terminal voltage of the battery, and the remaining capacity of the battery, at a predetermined current of the battery.

Further, the computer program causes a computer in a remaining-battery-capacity estimating apparatus, for estimating the remaining capacity of a battery to be measured, to function as, means for reducing the output voltage of a rectifier that supplies electrical power to an actual load; means for measuring current that flows from the rectifier and the battery to the actual load and a dummy load device provided separately from the actual load; means for controlling the load of the dummy load device such that the measured current is a predetermined value; and means for calculating the remaining capacity of the battery based on a discharging time of the battery and a terminal voltage of the battery corresponding to the discharging time, at a discharging current flowing in the dummy load device and the actual load, by referring to a battery-data storage section for storing battery data indicating the relationship among the discharging time of the battery, the terminal voltage of the battery, and the remaining capacity of the battery, at a predetermined current of the battery.

As described above, since a dummy load device is provided, the discharge current of the battery can be made constant, the discharging-voltage characteristic can be obtained with high precision. Furthermore, since such a voltage characteristic obtained with high precision is referred to and compared with battery data stored in the battery-data storage section, the precision of remaining-battery-capacity estimation can also be improved.

In addition, when the voltage of the battery decreases to a predetermined value or less while the battery supplies electrical power to the actual load and the dummy load device, the voltage reduction of the rectifier is discontinued. Therefore, even if the battery is discharged after the process of remaining-battery-capacity estimation is completed, it is possible to prevent a remaining capacity level of the battery from being too low to drive the actual load.

BRIEF DESCRIPTION OF THE DRAWINGS

Other features and advantages of the present apparatus, method and computer program will be apparent from the ensuing description, taken in conjunction with the accompanying drawings, in which.

DETAILED DESCRIPTION

While the claims are not limited to the illustrated embodiments, an appreciation of various aspects of the apparatus, method and computer program is best gained through a discussion of various examples thereof.

A remaining-battery-capacity estimating apparatus according to one embodiment will now be described with reference to the drawings.

The remaining-battery-capacity estimating apparatus in this embodiment causes a storage battery to discharge at any specified point in time, with any specified electric current, only for a specified period of time to estimate the remaining capacity of the storage battery from a discharge characteristic exhibited during that period of time. More specifically, in this embodiment, in order to cause the storage battery to discharge while electrical power is supplied to a load, the voltage output from a rectifier during operation is reduced to a specified value which is within a permissible voltage range of the load. In this state, however, the discharging current from the storage battery exhibits a current value required by the load. In order to carry out discharge from the storage battery with any specified constant current, a dummy load device is provided in this embodiment to adjust the electric current. In this manner, the storage battery can be discharged with a constant electric current, and hence, a so-called constant-current discharge characteristic can be obtained.

Since the remaining capacity of the storage battery is represented by a curve indicating the change in voltage over time during constant current discharge, the terminal voltage of the target battery is measured at any specified elapsed time. The capacity of the target battery corresponding to the measured terminal voltage value is estimated from battery data obtained in advance which shows the relationship between the remaining capacity and the terminal voltage of the battery.

A remaining-battery-capacity estimating apparatus according to an embodiment will now be described.

Figure 1:
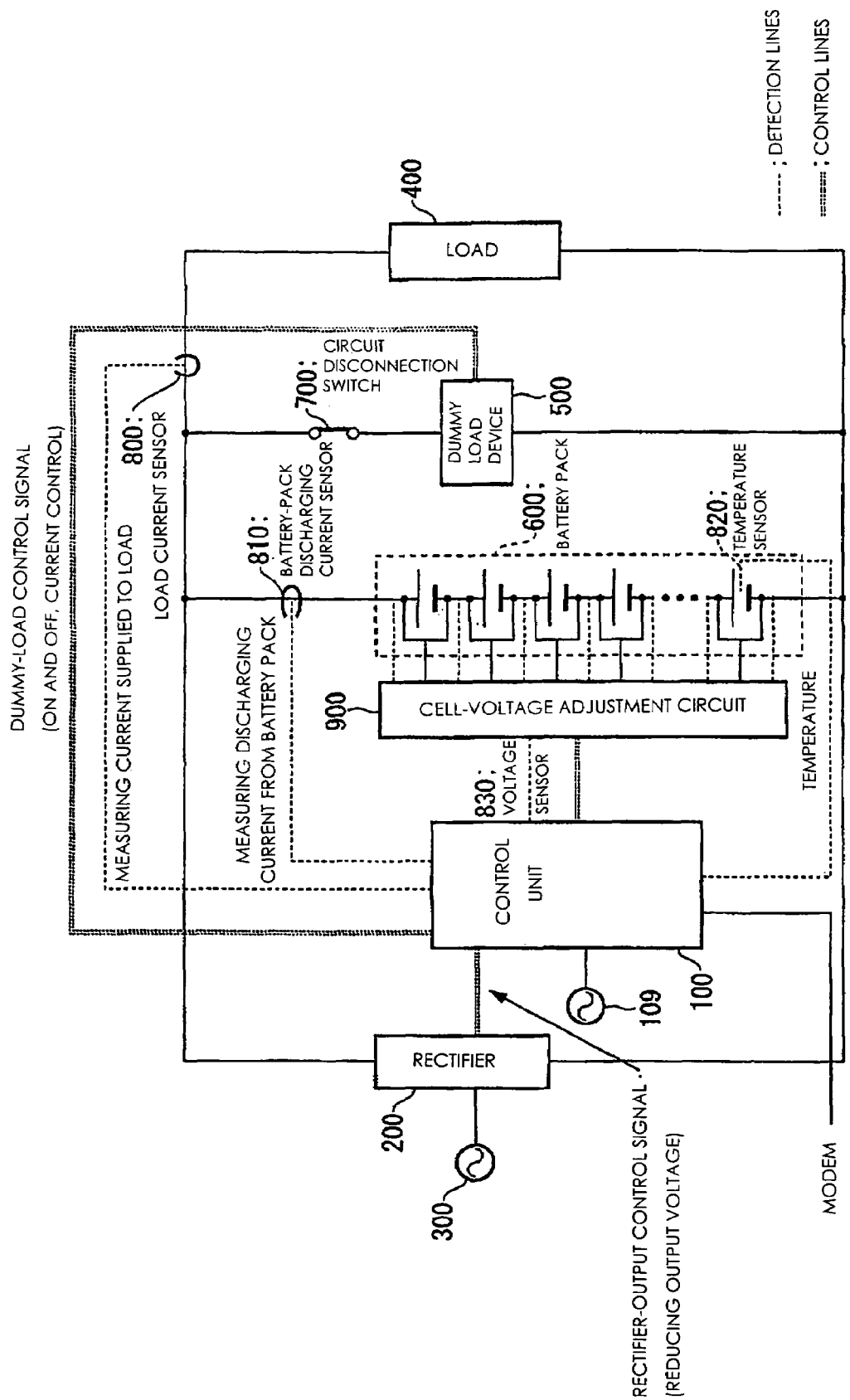
FIG. 1 is an outlined block diagram showing the structure of a DC power supply apparatus with a secondary-battery-remaining-capacity estimating function to which a remaining-battery-capacity estimating apparatus according to one embodiment is applied.

FIG. 1 is a schematic block diagram showing the structure of a DC power supply apparatus 1 with a secondary-battery remaining-capacity estimating function to which the remaining-battery-capacity estimating apparatus according to the embodiment is applied.

The DC power supply apparatus 1 with the secondary-battery remaining-capacity estimating function includes a control unit 100; an AC power supply 109; a rectifier 200; an AC power supply 300; a load 400; a dummy load device 500; a battery pack (may be referred to as the storage battery or the battery) 600; a circuit disconnection switch 700; a load current sensor 800; a battery-pack discharging current sensor 810; a temperature sensor 820; a voltage sensor 830; and a cell-voltage adjustment circuit 900.

AC power supplied from the AC power supply 300 is converted into DC power by the rectifier 200, and the DC power is supplied to the battery pack 600 and the load 400. The battery pack 600 is composed of a plurality of lithium-ion secondary batteries connected to one another and is connected to the rectifier 200 and the load 400 so that it can be charged and discharged.

The AC power supply 109 supplies AC current to the control unit 100.

Based on a dummy-load control signal from the control unit 100, the dummy load device 500 causes the battery pack 600 to discharge so that the sum of the current values of the load 400 and the dummy load device 500 exhibits a predetermined current value.

The circuit disconnection switch 700 is turned on and off based on and off signals included in the dummy-load control signal and disconnects the dummy load device 500 from the battery pack 600 when it is turned off.

The load current sensor 800 measures the current value supplied to the load 400 and outputs the measurement result to the control unit 100. The battery-pack discharging current sensor 810 detects the electric current supplied from the battery pack 600 and outputs the detection result to the control unit 100. The temperature sensor 820 measures the temperature of the battery pack 600 and outputs the measurement result to the control unit 100. The voltage sensor 830 detects the voltage of the battery pack 600 and outputs the detection result to the control unit 100. The cell-voltage adjustment circuit 900 controls the voltage of each cell of the lithium-ion secondary batteries which form the battery pack 600.

Figure 2:
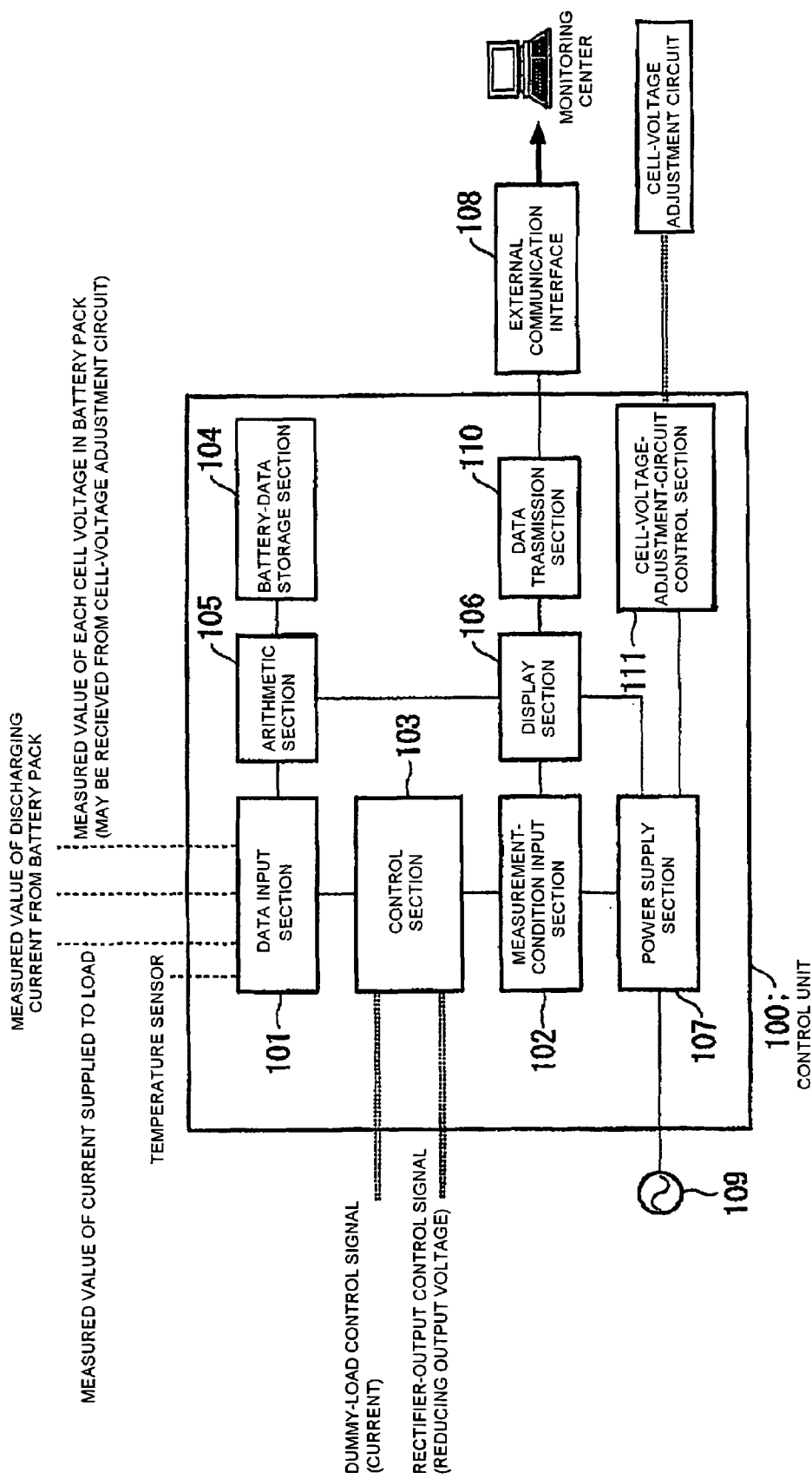
FIG. 2 is a schematic block diagram showing the structure of a control unit in the DC power supply apparatus.

The structure of the control unit 100 will now be described. FIG. 2 is a schematic block diagram showing the structure of the control unit 100.

A data input section 101 receives the measurement results output from the load current sensor 800, the battery-pack discharging current sensor 810, the temperature sensor 820, and the voltage sensor 830 and outputs the signals to a control section 103 and an arithmetic section 105. A measurement-conditions input section 102 has a function for accepting an input from a user and includes a keyboard and function keys. The control section 103 has a function for outputting a rectifier-output control signal to the rectifier 200 to reduce the voltage output from the rectifier 200 within the range of settings input from the measurement-conditions input section 102. The control section 103 also outputs a dummy-load control signal to the dummy load device 500 to perform control such that the sum of electric currents flowing in the load 400 and the dummy load device 500 exhibits a setting input from the measurement-conditions input section 102.

A battery-data storage section 104 stores for example, information about manufacturing, distribution, and the like of the battery, such as the manufacturer, supplier, and production lot, and battery data indicating relationships between terminal voltage differences and various remaining capacities of the battery at a given time; relationships between various remaining capacities of the battery and the differences between the open voltage of the battery before use (having a capacity of 100%) and terminal voltages of the battery having different remaining capacities when discharge is carried out; and relationships between different remaining capacities of the battery and the differences between a charge voltage for trickle charging (may be abbreviated as a "trickle charge voltage" in the following descriptions and figures) and terminal voltages of the battery having different remaining capacities when discharge is carried out therefrom.

Here, the "remaining capacity" means a capacity of a completely charged backup storage battery in the power supply system.

Figure 3:
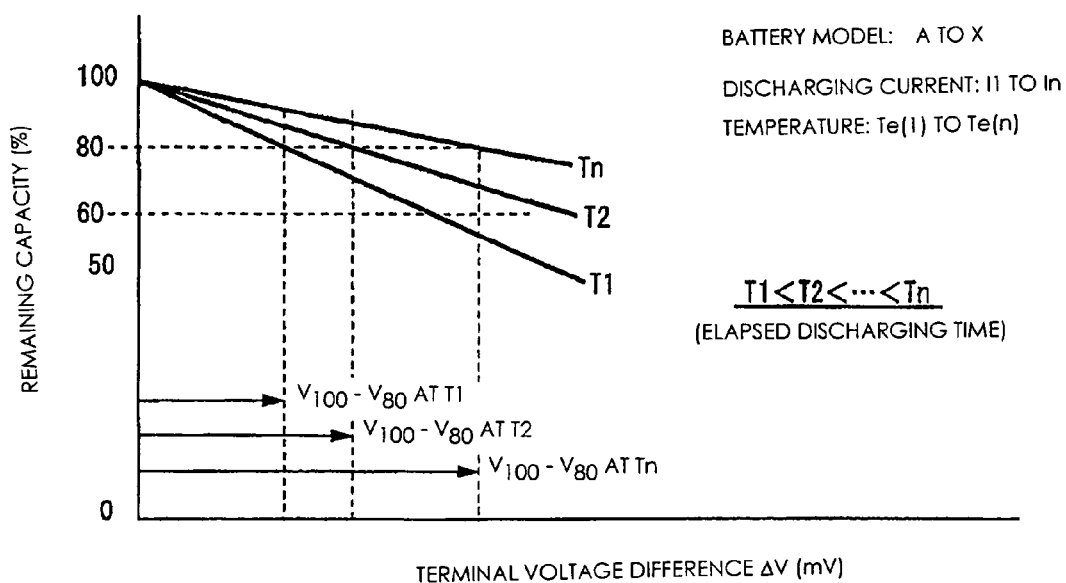
FIG. 3 is a diagram showing example battery data stored in a battery-data storage section in the control unit.

FIG. 3 shows an example of the battery data stored in this battery-data storage section 104. FIG. 3 illustrates the battery data indicating the relationships between remaining capacities of the battery and the differences $\Delta V$ between the terminal voltage of the battery having a capacity of 100% and terminal voltages of the battery with reduced capacities at a given elapsed discharging time.

The terminal voltage difference $\Delta V$ may be calculated from the stored terminal voltage of the battery having the capacity of 100% and measured terminal voltage. Based on the relationship between the terminal voltage difference $\Delta V$ and the given discharging time (T1, T2 . . . or Tn), the remaining capacity of the battery is calculated. In FIG. 3, V80 and V100 represent terminal voltage of the battery having 80% capacity and 100% capacity, respectively, and "V100–V80 shows the terminal voltage difference $\Delta V$ from which the remaining capacity of the battery is calculated (in case of V100–V800, the battery has 80% capacity). In FIG. 3, the terminal voltage difference $\Delta V$ at T1, T2, and Tn are shown as examples.

Figure 4:
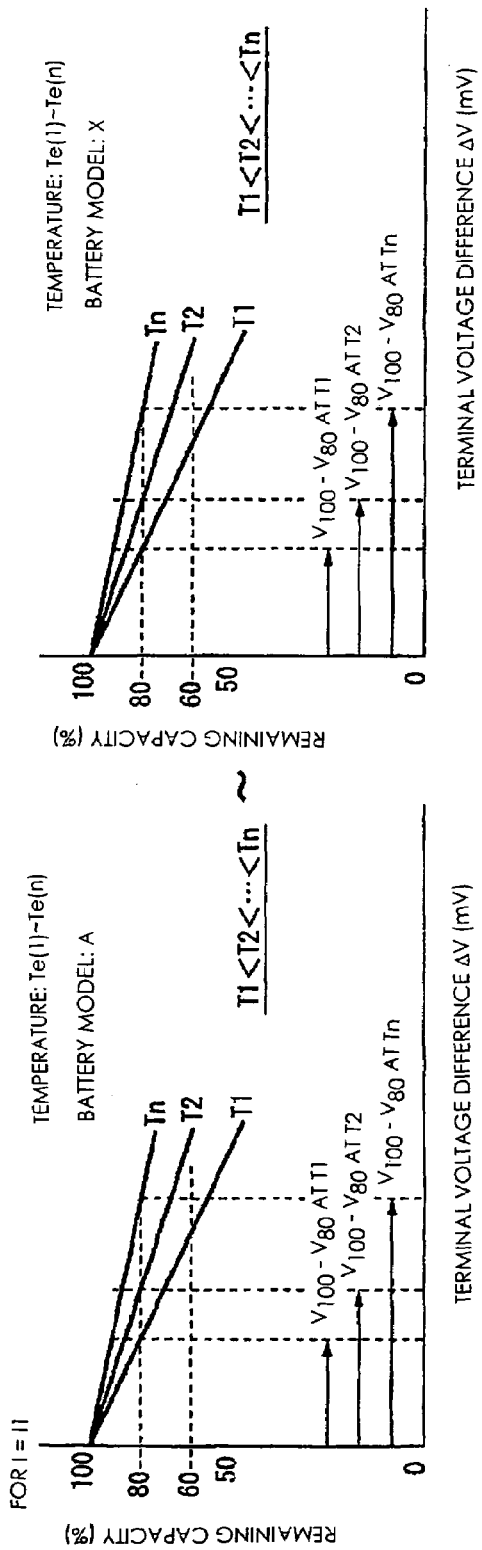
FIG. 4 is a diagram showing example battery data.
Figure 4:
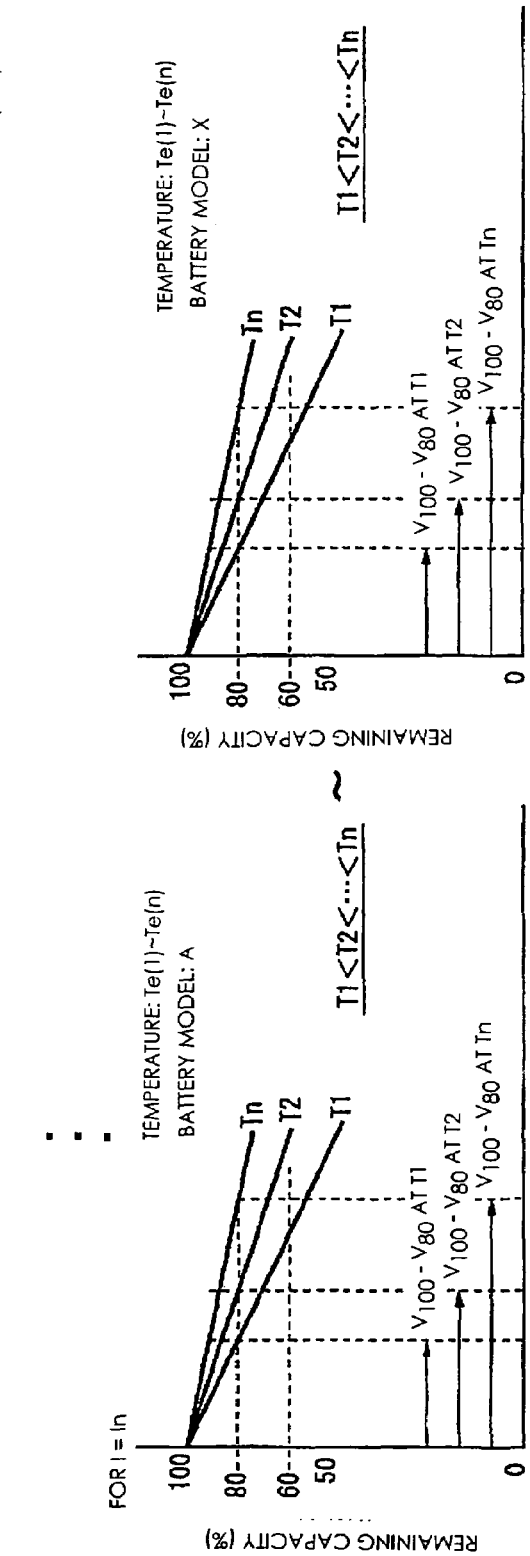

This battery data is stored for each battery model (A to X) and for each current value I1 to In. Example battery data stored in this manner is shown in FIG. 4. This example battery data is generated for each different temperature Te(n) as required.

The arithmetic section 105 has a function for receiving the terminal voltage value of the battery pack 600 output from the data input section 101 and a function for comparing the received terminal voltage value and data stored in the battery-data storage section 104 thereby calculating the remaining capacity of the battery to be measured so as to determine the battery is deteriorated.

A display section 106 displays the calculation result of the arithmetic section 105 with a meter. A power supply section 107 converts a 100-VAC output from the AC power supply 109 into DC power, functioning as an internal power supply of the remaining-battery-capacity estimating apparatus 100. A data transmission section 110 is connected to a terminal of a monitoring center via an external communication interface 108 and transmits data indicating the calculation result of the arithmetic section 105 to the terminal of the monitoring center. A cell-voltage-adjustment-circuit control section 111 outputs control signals for controlling cell voltages to the cell-voltage adjustment circuit 900.

Figure 5:
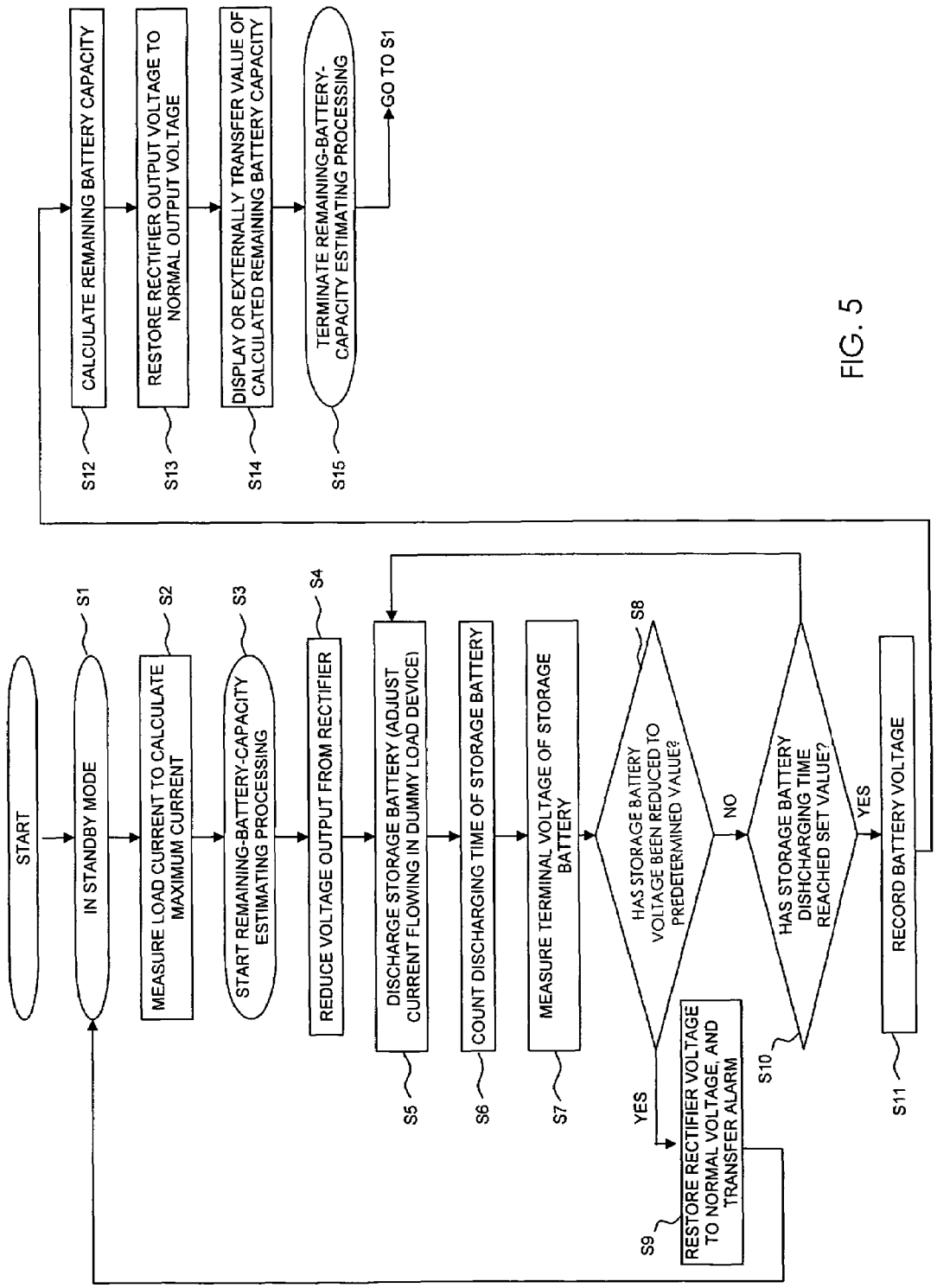
FIG. 5 is a flowchart illustrating the operation of the DC power supply apparatus.

Next, an operation of the above-described DC power supply apparatus 1 having the secondary-battery remaining-capacity estimating function will be described with reference to a flowchart shown in FIG. 5.

First, in a standby state (step S1), a load current supplied from the rectifier 200 to the load 400 is measured to calculate the maximum current value (step S2). Then, when an instruction for starting remaining-battery-capacity estimating processing is input by the user from the measurement-conditions input section 102, the remaining-battery-capacity estimating processing is started (step S3). Following the instruction for starting the remaining-battery-capacity estimating processing, a user-input setting of discharging time for which reduction of the voltage output from the rectifier 200 continues and a user-input setting of electric current are accepted.

When these settings are input, the control section 103 outputs a rectifier-output control signal to the rectifier 200 to reduce the output voltage of the rectifier 200 (step S4).

When the voltage output from the rectifier 200 is reduced, the battery pack 600 starts discharging. The control section 103 appropriately controls the current flowing through the dummy load device 500 using the dummy-load control signal such that the sum of the current values of the load 400 and the dummy load device 500 (the current detected by the battery-pack discharging current sensor 810) equals to the specified constant current value (step S5).

In addition, the control section 103 starts counting the storage battery discharging time from the time when the remaining-battery-capacity estimating processing is started (step S6). The terminal voltage of the battery pack 600 is measured with the voltage sensor 830 (step S7) to determine whether the voltage of the battery pack 600 has decreased to a predetermined value (step S8). When the voltage of the battery pack 600 has decreased to the predetermined value, the voltage reduction of the rectifier 200 is discontinued to return the voltage output from the rectifier 200 to the normal voltage. An alarm is also transferred to the terminal of the monitoring center (step S9), and the flow proceeds to step S1.

On the other hand, when the voltage of the battery pack 600 is over the predetermined value, it is determined whether the count value of the storage battery discharging time reaches the discharging time input from the measurement-conditions input section 102 (step S10). If the count value has not reached the discharging time, the flow proceeds to step S5.

If the count value has reached the discharging time, the terminal voltage of the target battery at that discharging time is measured with the voltage sensor 830, and the measurement result of the temperature sensor 820 and the measured voltage value are recorded (step S11). Then, the arithmetic section 105 calculates the remaining battery capacity based on the recorded battery voltage by referring to battery data stored in the battery-data storage section 104, namely, the battery data corresponding to the measured time and the measured temperature (step S12).

To calculate the remaining battery capacity, the relationships between terminal voltage differences and different remaining capacities of the battery at a given time, which can be obtained from the discharging characteristics of the storage battery having the different remaining capacities (terminal-voltage versus time characteristic), can be used. It is necessary to obtain the above-described relationships at a given discharging current and a given ambient temperature in advance. The remaining battery capacity can also be calculated based on the relationships between different remaining capacities of the battery and the differences between the open voltage of the battery before use (having a capacity of 100%) and terminal voltages of the battery having the different remaining capacities, obtained when it is being discharged. Furthermore, the remaining battery capacity can be calculated from the relationships between different remaining capacities of the battery and the differences between a charge voltage for trickle charging and terminal voltages of the battery having the different remaining capacities, obtained when it is being discharged. It is noted that, according to the measurement result of the temperature sensor 820 and the battery model input from the measurement-conditions input section 102, the battery data satisfying these conditions is selected and referred to.

When the remaining battery capacity is calculated, the control section 103 changes back the output voltage of the rectifier 200 to the normal output voltage (step S13) and then outputs the value of the calculated remaining battery capacity (step S14). This output is achieved through display at the display section 106 and transmission to the terminal of the external monitoring center from the data transmission section 110.

Then, once the measurement result is output, the control section 103 terminates the process to determine whether the battery is deteriorated, that is, the process for the remaining-battery-capacity estimating (step S15).

While this processing is in progress, detections of a power failure or rectifier malfunction is carried out concurrently. Once such a failure occurs, power supply from the battery pack 600 to the load 400 is continued so that the remaining-battery-capacity estimating in this processing is cancelled. After recovery from a power failure, the output voltage of the rectifier 200 is set to the normal value, and power supply to the load 400 and charging of the battery pack 600 are carried out.

Figure 6:
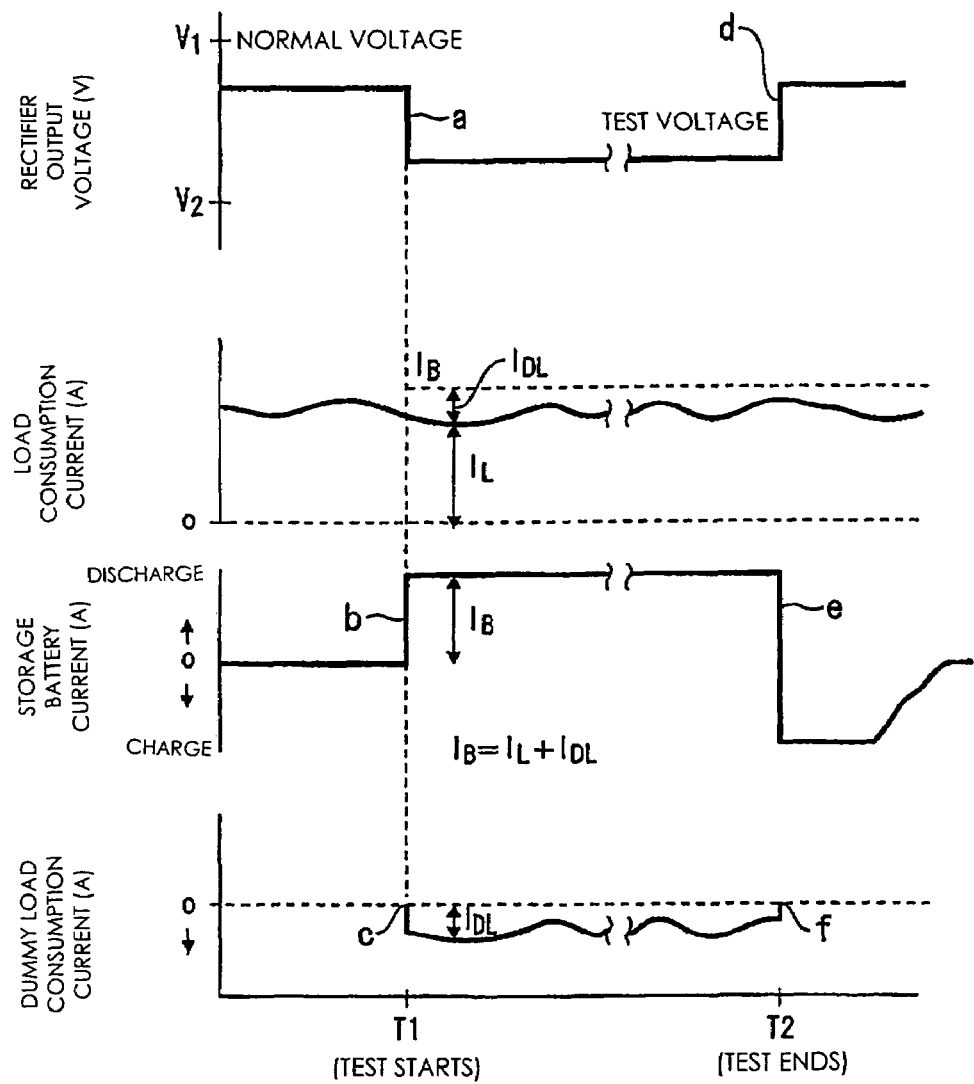
FIG. 6 is a diagram illustrating the operation of the DC power supply.

The operation of the DC power supply apparatus 1 having the secondary-battery remaining-capacity estimating function will further be described with reference to FIG. 6.

When a battery deterioration detecting (remaining-battery-capacity estimating) test is started at time T1, the output voltage of the rectifier 200 is reduced (indicated by "a") according to a command from the control section 103. When the output voltage decreases, electrical power is supplied from the battery pack 600, and thereby, a storage battery current flows therefrom (indicated by "b"), resulting in a dummy-load consumption current (indicated by "c"). Thereafter, when the test is completed at time T2 after a specified discharging time elapses, the output voltage of the rectifier 200 is change back to the normal voltage (indicated by "d") to start charging the battery pack 600 (indicated by "e") based on a command from the control section 103. Subsequently, the circuit disconnection switch 700 of the dummy load device 500 is turned off, so that the dummy-load consumption current becomes zero (indicated by "f"). In this figure, an equation "storage-battery discharging current IB=dummy load current IDL+load current IL" holds.

This means that, in the battery deterioration detecting test, the output voltage of rectifier 200 is set so that the output voltage is higher than the low limit voltage value at which the load 400 is operational, and the power is supplied to the load 400 only by discharge of the storage battery.

Figure 7:
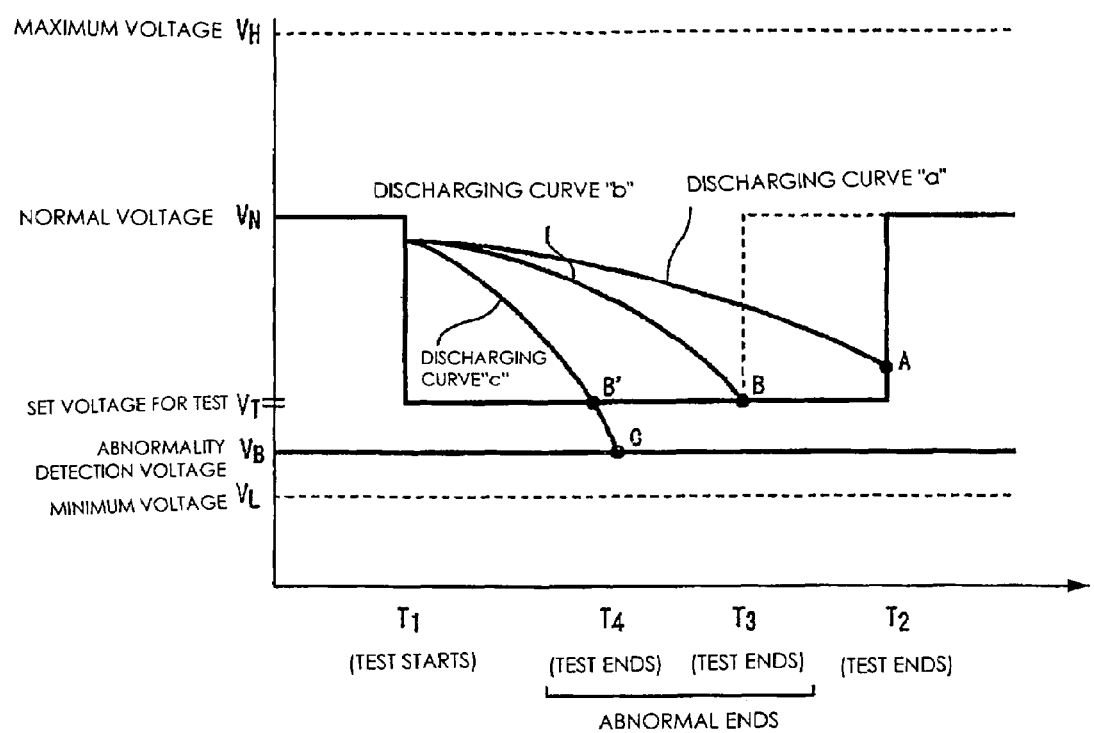
FIG. 7 is a diagram illustrating the relationship between set voltages and the discharging voltage of a storage battery during a discharging test.

Furthermore, relationships between set voltages and the discharge voltage of the storage battery during a discharge test will be described with reference to FIG. 7. The figure shows the upper and lower limits of the power supply voltage in a DC feeding system, a normal rectifier-operating voltage VN, and a rectifier voltage VT during the test. The rectifier voltage VT during the test is set to a value higher than the lower-limit voltage of the system. When the test starts, the rectifier output voltage is set to the rectifier voltage VT, and the storage battery starts discharging at the same time. In the case of a normal storage battery whose remaining capacity is not extremely low, the voltage changes over time along a discharging curve indicated by "a", and the test ends at predetermined time T2. For a battery having a low remaining capacity, discharge proceeds along a discharging curve indicated by "b", and the test is completed in a shorter period of time (point B) than the set discharging time. Since the voltage of the storage battery becomes the same as the rectifier output voltage at the point B, discharge from only the storage battery cannot be performed, and hence, the test ends practically. When the control section 103 detects this state, remaining-battery-capacity estimation is performed before this time T3, and the voltage reduction of the rectifier is discontinued so that it will be changed back to the normal voltage VN. An abnormality detection voltage VB is set to protect the system such that no problem occurs if the control section 103 overlooks this state upon reaching point B. This case is illustrated by a discharging curve indicated by "c". More specifically, when the control section 103 fails to detect the end of the test at point B', discharge proceeds further. When the voltage decreases to the minimum voltage VL of the system, there is a risk of adversely affecting the load. To overcome this problem, the abnormality detection voltage VB is set to terminate the test if the output from the system decreases to this voltage. Processes such as canceling the output reduction of the rectifier and issuing an alarm are performed.

The calculation for the remaining-battery-capacity estimation can be carried out two or more times, instead of just once, within the maximum discharging time set when the test is started. The test can be terminated when the calculated value has a target precision through several estimations (for example, after 3 to 4 times measurements, the measured values fall within 5% range) within in this way even before the set discharging time is reached. On the other hand, as long as the calculated value does not have the target precision, discharge is continued until the set discharging time for remaining capacity estimation is reached, and then the test is ended.

According to the embodiment described above, the control section 103 changes back the output voltage of the rectifier 200 to an appropriate value after the remaining battery capacity is calculated. Because of this, the rectifier 200 not only supplies power to the load 400 but also charges the battery pack 600, thus preventing the quality of electrical power supplied to the load 400 from being adversely affected.

Furthermore, according to this embodiment, when the battery voltage of the battery pack 600 decreases to the predetermined value, the control section 103 changes back the output voltage of the rectifier 200 to the normal value. Therefore, the storage battery can be prevented from being fully discharged in case of an emergency such as a power failure after the discharge test is ended. In addition, since some voltages to be detected are set, a problem caused by the test is prevented from occurring in the system.

Figure 8A:
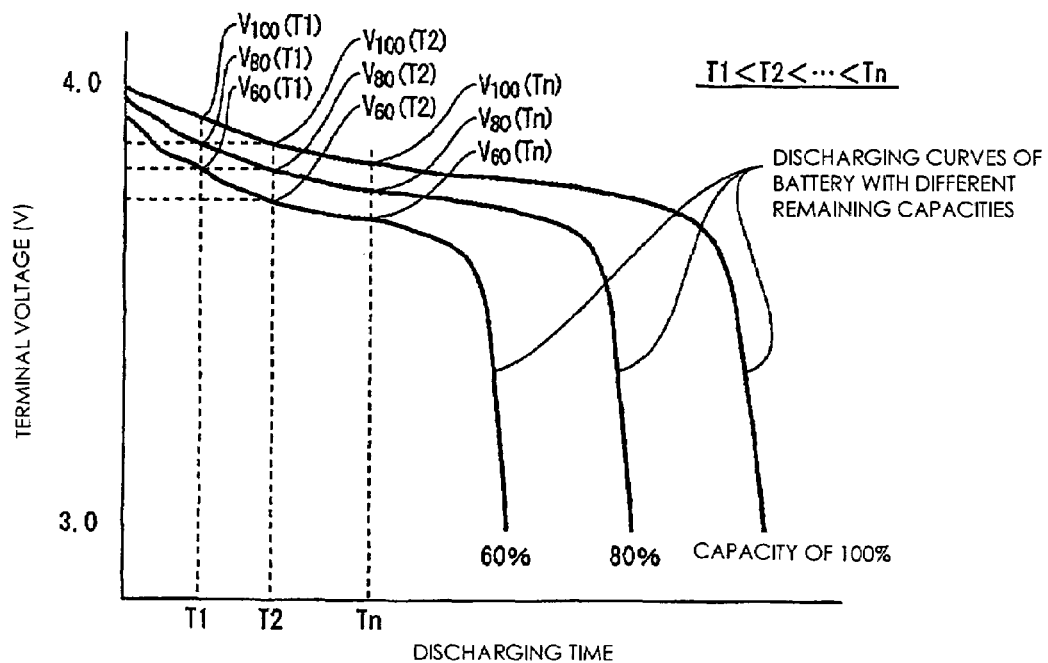
FIG. 8A is an outlined diagram showing a discharging curve of a battery in the initial state and discharging curves of the battery with different remaining capacities.
Figure 8B:
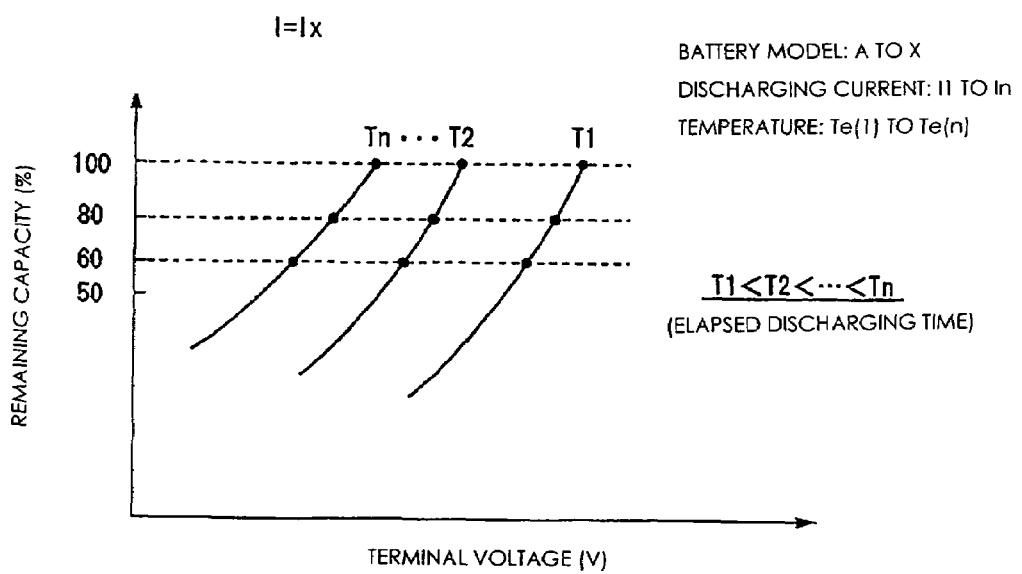
FIG. 8B is a diagram showing the relationship, in a battery with different remaining capacities, between terminal voltages and the remaining capacities at different discharging times.

Although, in the above-described embodiment, the battery data indicating the relationships between voltage differences ΔV and remaining capacities of the battery is stored in the battery-data storage section 104, date indicating discharging curves shown in FIGS. 8A and 8B can also be used. FIG. 8A is a schematic diagram showing a discharging curve of the battery having a capacity of 100% and discharging curves of the battery having different remaining capacities. In this figure, Vcn(Tn) represents a terminal voltage of the battery having a remaining capacity Cn when a discharging time Tn has elapsed. In other words, this figure shows the relationship between remaining capacities and terminal voltages of the battery at various elapsed times, for each battery model and each discharging current. FIG. 8B is a diagram showing the relationships between different remaining capacities and terminal voltages of the battery having the different remaining capacities at different elapsed discharging times. By using the relationships obtained in this manner, the remaining capacity of the battery can be estimated by measuring the terminal voltage of the battery at a predetermined discharging current after a specified discharging time has elapsed.

Figure 9:
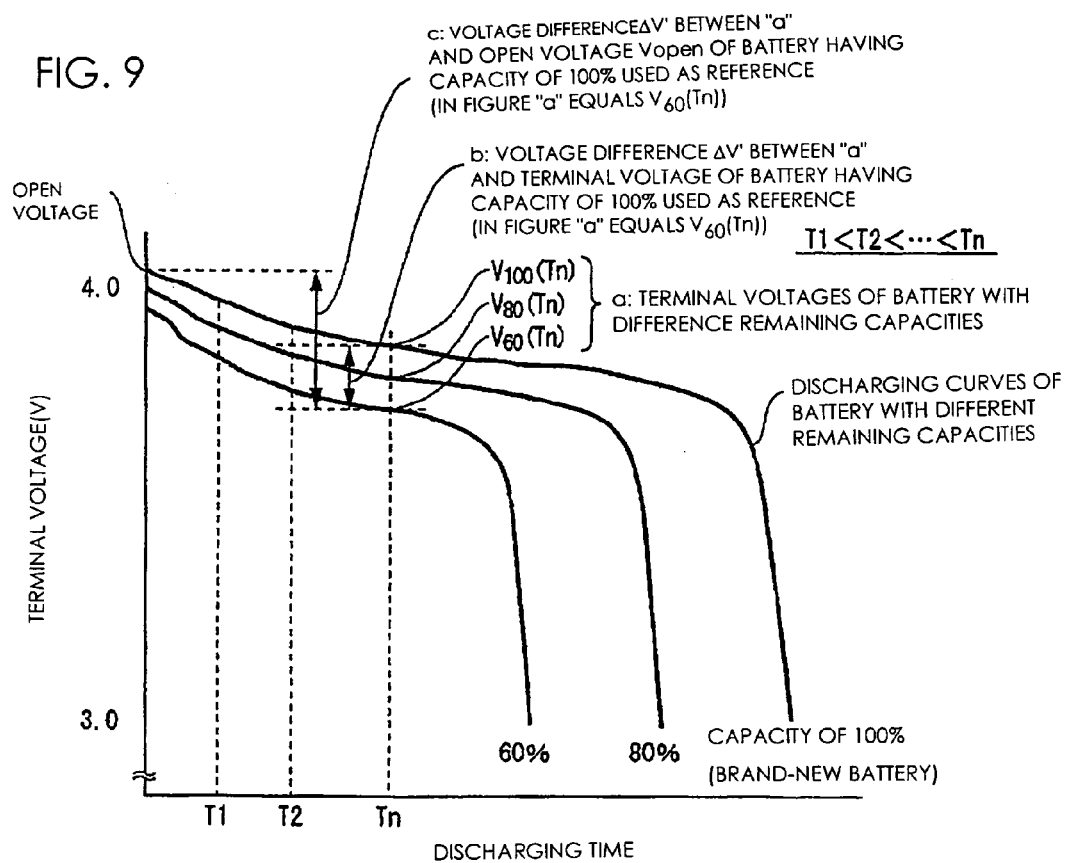
FIG. 9 is a diagram showing differences $\Delta V$ between the terminal voltage of a battery in the initial state and the terminal voltages of the battery with different remaining capacities at different discharging times.

Another piece of information can also be used as the battery data to be stored in the battery-data storage section 104. FIG. 9 is a diagram showing the differences ΔV between the terminal voltage of the battery before use (having a capacity of 100%) and the terminal voltages of the battery having different remaining capacities at different discharging times. In FIG. 9, V100(Tn) represents the terminal voltage of the battery before use (having a capacity of 100%), V80(Tn) represents the terminal voltage of the battery having a remaining capacity of 80%, and V60(Tn) represents the terminal voltage of the battery having a remaining capacity of 60%, after discharging time Tn has elapsed. In this figure, the voltage difference ΔV between the terminal voltage V100 (Tn) of the battery in the initial state and the terminal voltage V60(Tn) of the battery having a remaining capacity of 60% after the discharging time Tn has elapsed is indicated by an arrow "b".

Based on such discharging characteristics, information indicating relationships between different remaining capacities of the battery and voltage differences ΔV' (such as that indicated by an arrow "c" in FIG. 9) between the open voltage Vopen of the battery in the initial state and the terminal voltages of the battery having the different remaining capacities, at each discharging time, may be used.

Figure 10:
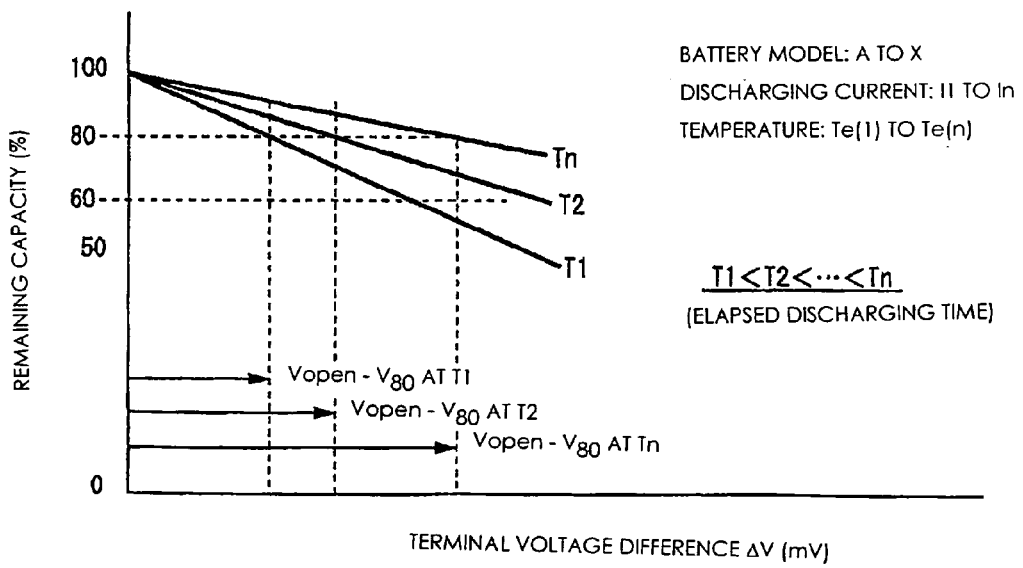
FIG. 10 is a diagram showing a difference between the open voltage of a battery with a capacity of 100% and the terminal voltages of the battery with different remaining capacities at a given elapsed discharging time.
Figure 11:
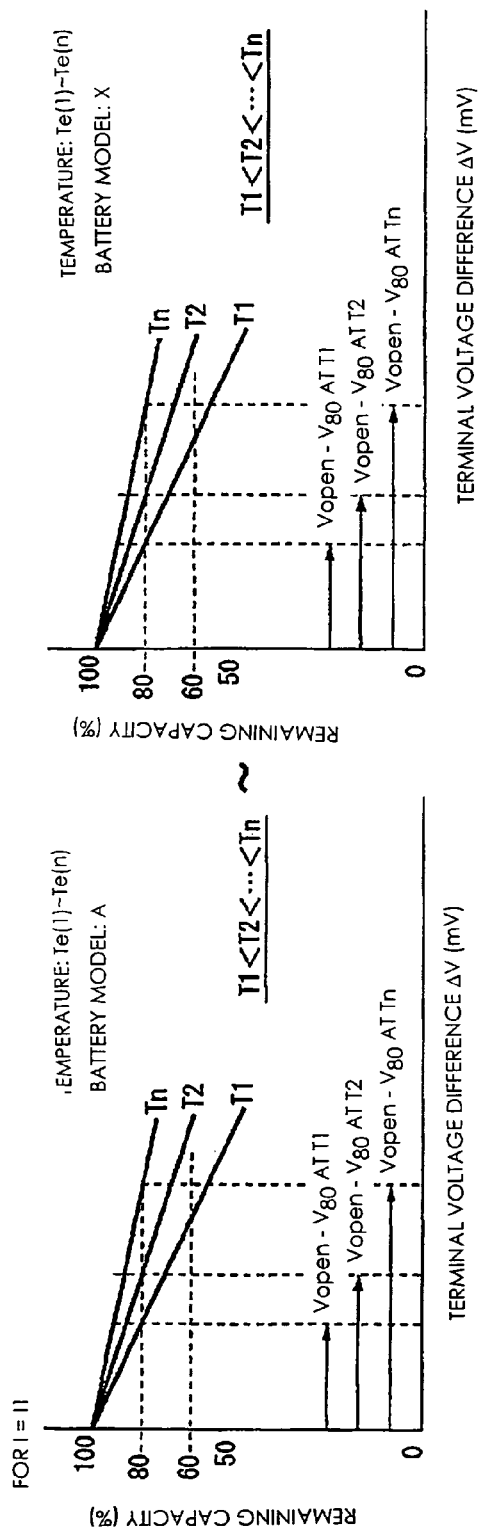
FIG. 11 is a diagram showing example battery data.
Figure 11:
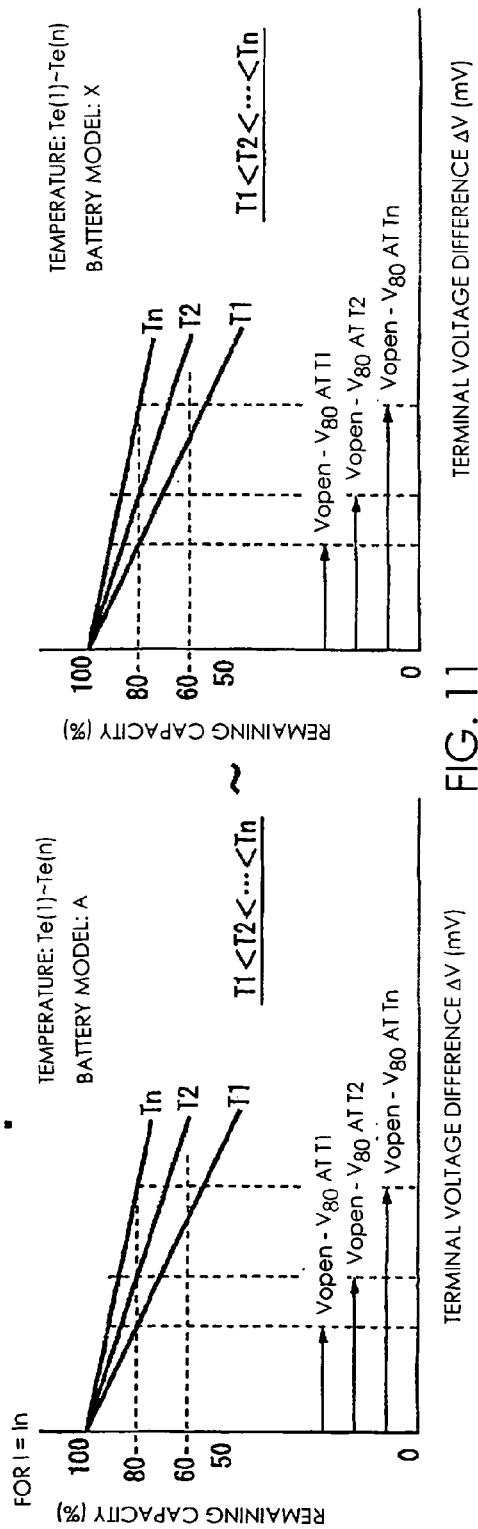

FIG. 10 is a diagram showing differences between the open voltage of the battery having a capacity of 100% and the terminal voltages of the battery having different remaining capacities at a given elapsed discharging time. In this case, the battery-data storage section 104 stores battery data indicating the relationships shown in this figure. One example of battery data stored in this manner is shown in FIG. 11. Such battery data is generated for each battery model. The relationships between different remaining capacities of the battery and the differences between a charge voltage of the battery for trickle charging and terminal voltages of the battery having the different remaining capacities when it is being discharged can also be generated. Since the battery charge is maintained with a charging apparatus, such as a rectifying apparatus, the relationships based on the charge voltage for trickle charging rather than the open voltage are more practical in an actual power supply system.

Figure 12:
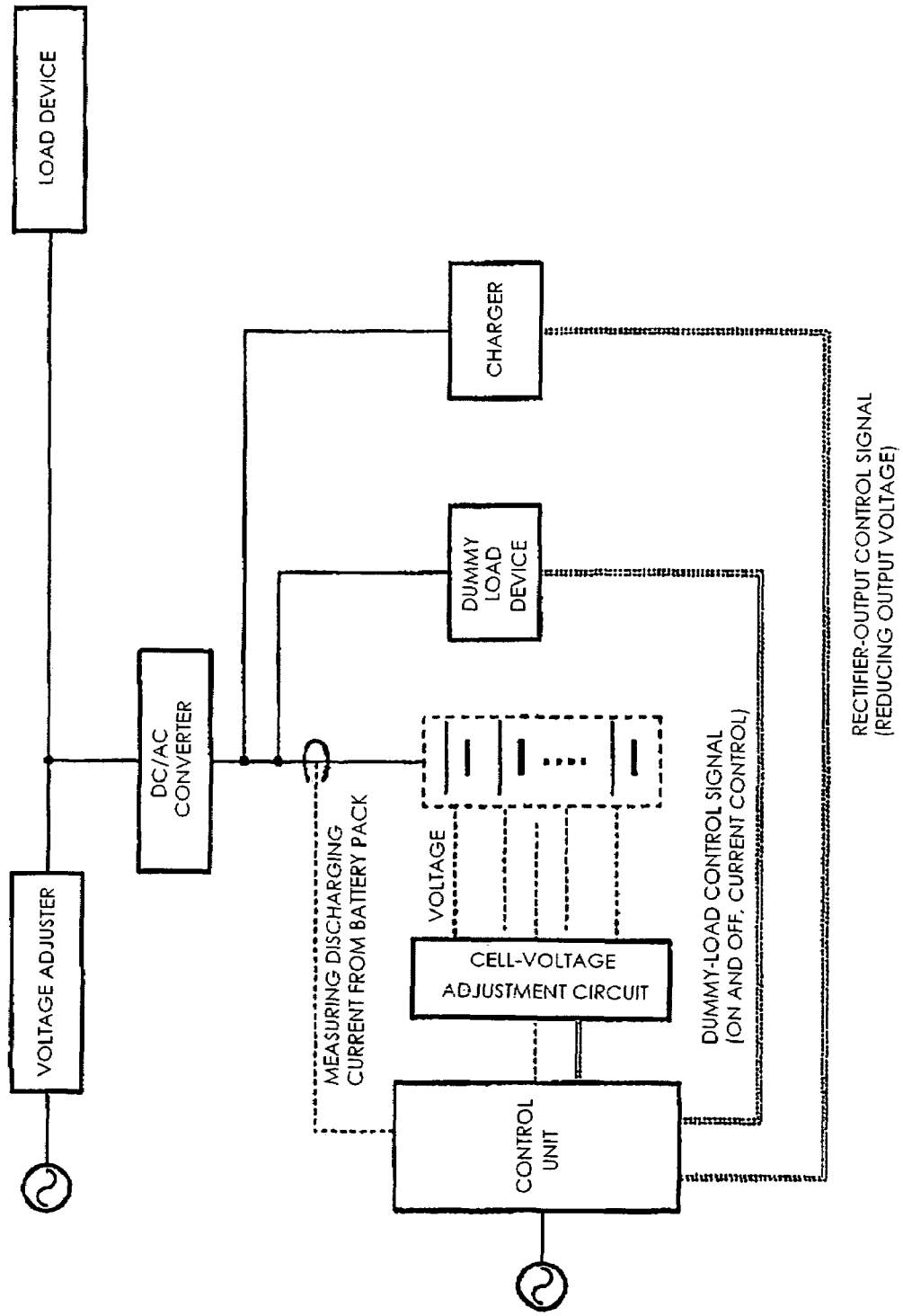
FIG. 12 is an outlined block diagram showing an example application in which an automatic secondary-battery-remaining-capacity estimating function is applied to an AC power supply apparatus.
Figure 13:
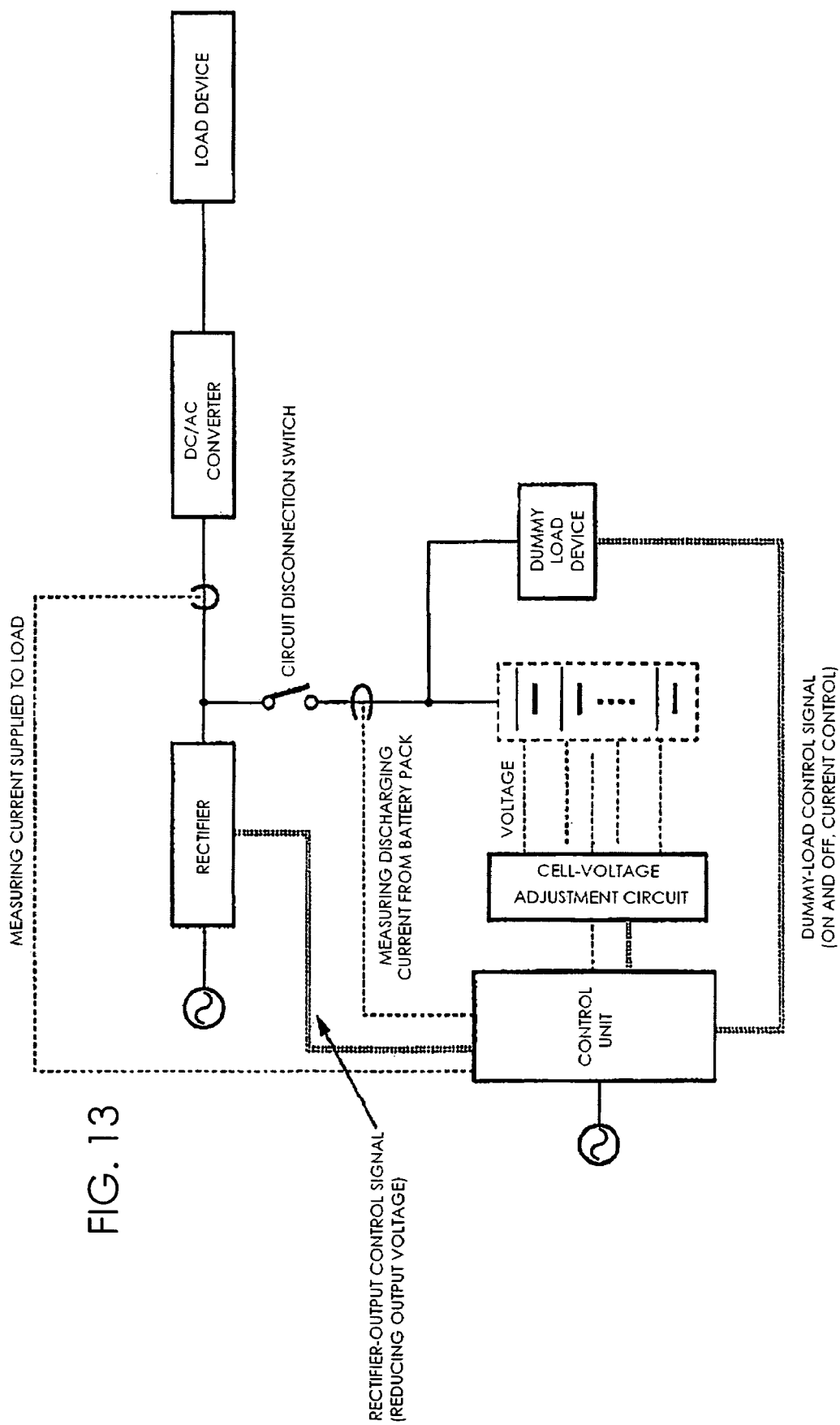
FIG. 13 is an outlined block diagram showing another example application in which an automatic secondary-battery-remaining-capacity estimating function is applied to an AC power supply apparatus.

Although the foregoing embodiment has been described by way of an example where electrical power supplied to the load 400 is DC power, it can be applied not only to DC supply systems but also to AC supply systems. FIGS. 12 and 13 are schematic block diagrams showing example cases where an automatic remaining-secondary-battery-capacity estimating function is applied to AC power supply apparatuses. As shown in each of FIGS. 12 and 13, in an AC power supply system provided with a dedicated charger for a backup storage battery, the charge voltage of the dedicated charger is adjusted, whereas the voltage of the rectifier is adjusted in the DC supply system, and the storage battery is discharged to supply power to a dedicated dummy load, instead of an actual load. However, the basic mechanism for estimating the remaining battery capacity by using constant current discharging of the storage battery is the same as in the foregoing embodiment.

In order to prevent the load from being adversely affected by, for example, over-discharging during discharge in a test, the total voltage of the battery pack 600 can be measured so that discharging of the storage battery can be terminated when the measured voltage decreases to a preset voltage value thereby preventing a hazard.

The remaining battery capacity may be estimated by executing a program for achieving the functions of the control apparatus 100 shown in FIG. 1 which is recorded on a computer-readable recording medium, in which a computer system reads and executes the program recorded on this recording medium so as to perform the battery deterioration detecting test.

Embodiments of the present invention have been described in detail with reference to the attached drawings. The preceding description has been presented only to illustrate and describe exemplary embodiments of the methods and apparatuses of the claimed invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope. The scope of the invention is limited solely by the following claims.

What is claimed is:

1. A remaining-battery-capacity estimating apparatus for estimating a remaining capacity of a battery to be measured, comprising:
    a rectifier that is connected in parallel to the battery to be measured, and supplies electric power to an actual load;
    an actual load connected in parallel to the rectifier, wherein the rectifier supplies electric power to the actual load;
    a rectifier-voltage control section that reduces an output voltage of the rectifier;
    a dummy load device provided separately from the actual load and connected in parallel to the rectifier;
    a load-current measurement section that measures current that flows through the actual load and the dummy load device from the rectifier and the battery;
    a control section that controls a load of the dummy load device such that the current measured by the load-current measurement section is a predetermined value;
    a battery-data storage section that stores battery data indicating relationship among a discharging time of the battery, a terminal voltage of the battery, and remaining capacity of the battery, at a predetermined current of the battery; and
    an arithmetic section that calculates the remaining capacity of the battery based on the discharging time of a discharging current flowing through the dummy load and the actual load, and the terminal voltage of the battery corresponding to the discharging current at the discharging time by referring to the battery data stored in the battery-data storage section.

2. The remaining-battery-capacity estimating apparatus according to claim 1, wherein the battery data indicating the relationship is one between the remaining capacity of the battery and difference between a discharge terminal voltage of the battery at a given discharging current at a given elapsed discharging time and a charge terminal voltage of the battery maintained in a state where the battery is charged, before discharging.

3. The remaining-battery-capacity estimating apparatus according to claim 1, wherein the battery data indicating the relationship is one between the remaining capacity of the battery and difference between a reference terminal voltage of the battery in a reference charged state and a discharge terminal voltage of the battery in a discharged state, at a given discharging current at a given elapsed discharging time.

4. The remaining-battery-capacity estimating apparatus according to claim 1, wherein the battery data indicating the relationship is one between the terminal voltage of the battery and an elapsed discharging time of the battery for each remaining capacity of the battery.

5. The remaining-battery-capacity estimating apparatus according to claim 1, wherein the battery data stored in the battery-data storage section stores includes at least one of manufacturers, suppliers, production lots, models, temperatures, discharging current values, and elapsed discharging time of the battery, for each discharging condition.

6. The remaining-battery-capacity estimating apparatus according to claim 1, wherein the rectifier-voltage control section stops reducing the voltage output from the rectifier when the voltage of the battery decreases to a predetermined value while electrical power is supplied from the battery to the actual load and the dummy load device.

7. The remaining-battery-capacity estimating apparatus according to claim 2, wherein the rectifier-voltage control section stops reducing the voltage output from the rectifier when the voltage of the battery decreases to a predetermined value while electrical power is supplied from the battery to the actual load and the dummy load device.

8. The remaining-battery-capacity estimating apparatus according to claim 3, wherein the rectifier-voltage control section stops reducing the voltage output from the rectifier when the voltage of the battery decreases to a predetermined value while electrical power is supplied from the battery to the actual load and the dummy load device.

9. The remaining-battery-capacity estimating apparatus according to claim 4, wherein the rectifier-voltage control section stops reducing the voltage output from the rectifier when the voltage of the battery decreases to a predetermined value while electrical power is supplied from the battery to the actual load and the dummy load device.

10. The remaining-battery-capacity estimating apparatus according to claim 5, wherein the rectifier-voltage control section stops reducing the voltage output from the rectifier when the voltage of the battery decreases to a predetermined value while electrical power is supplied from the battery to the actual load and the dummy load device.

11. A remaining-battery-capacity estimating method for estimating a remaining capacity of a battery to be measured, comprising the steps of:
    reducing an output voltage of a rectifier that is connected in parallel to the battery to be measured, and supplies electrical power to an actual load;
    measuring current flowing through the actual load and a dummy load device provided separately from the actual load from the battery and the rectifier;
    controlling the dummy load device such that the measured current is a predetermined value; and
    calculating remaining capacity of the battery based on a discharging time of the battery and a discharge terminal voltage of the battery corresponding to the discharging time, at a discharging current flowing through the dummy load device and the actual load device, by referring to a battery-data storage section that stores battery data indicating a relationship among the discharging time of the battery, the terminal voltage of the battery, and the remaining capacity of the battery, at a predetermined current of the battery.

12. A computer program product for causing a computer in the remaining-battery-capacity estimating apparatus according to claim 1, said computer program product stored on a computer readable medium and including a program code for estimating the remaining capacity of the battery to be measured, to function as:

means for reducing an output voltage of a rectifier that supplies electrical power to an actual load;

means for measuring current that flows through the actual load and a dummy load device provided separately from the actual load from the rectifier and the battery;

means for controlling a load of the dummy load device such that the measured current is a predetermined value; and means for calculating the remaining capacity of the battery based on a discharging time of the battery and a discharge terminal voltage of the battery corresponding to the discharging time, at a discharging current flowing through the dummy load device and the actual load, by referring to a battery-data storage section for storing battery data indicating a relationship among the discharging time of the battery, the terminal voltage of the battery, and the remaining capacity of the battery, at a predetermined current of the battery.

* * * * *